United States Patent [19]

Scranton

[11] 4,347,583
[45] Aug. 31, 1982

[54] NEEL WALL SEGMENT DETECTION IN CROSS-TIE MEMORY SYSTEMS

[75] Inventor: Robert A. Scranton, Ossining, N.Y.

[73] Assignee: International Business Machines Corporation, Armonk, N.Y.

[21] Appl. No.: 160,511

[22] Filed: Jun. 18, 1980

[51] Int. Cl.³ .................... G11C 7/00; G11C 19/08
[52] U.S. Cl. .................................................... 365/87
[58] Field of Search ................................ 365/87, 158

[56] References Cited

U.S. PATENT DOCUMENTS 4,161,789  7/1979  Torok et al. ...................... 365/87
4,192,012  3/1980  Schwee et al. ..................... 365/87

Primary Examiner—James W. Moffitt
Attorney, Agent, or Firm—Joseph E. Kieninger

[57] ABSTRACT

A method and device for detecting Neel wall segments in a cross-tie memory system involves applying a magnetic field to the Neel wall segments of a given polarity so that these Neel wall segments expand into a transverse domain. The transverse domain is then sensed with a magnetoresistive detector.

5 Claims, 3 Drawing Figures

NEEL WALL SEGMENT DETECTION IN CROSS-TIE MEMORY SYSTEMS

DESCRIPTION

1. Technical Field

This invention relates to cross-tie memory systems and more particularly to a method and device for Neel wall segment detection.

It is a primary object of this invention to provide an improved cross-tie memory system.

It is another object of this invention to provide an improved method and device for the detection of Neel wall segments.

It is yet another object of this invention to provide an improved magnetoresistive sensing method for detecting Neel wall segments.

2. Background Art

Cross-tie memories are described in the U.S. Pat. No. 3,868,659 to Schwee and in the Schwee et al "Naval Ordinance Laboratory Technical Report," 74-176 Oct. 1, 1974. In a cross-tie memory, information is stored in magnetic domain walls as Neel wall segments. The magnetic domain wall is located between two adjacent anti-parallel, that is, opposite polarity, domains. The cross-tie memory is in a thin magnetic film of a material such as permalloy.

It is reported that an optical method of detection based on the Kerr rotation of polarized light reflected from the permalloy film is superior to the two known magneto-resistive detection techniques. One magnetoresistive sensing method is described in the U.S. Pat. No. 3,868,660 to Schwee which describes the use of a probe means above the domain wall and the use of a localized magnetic field to cause the domain wall to undergo wall reversal motion which is subsequently sensed. This method is not considered to be suitable because the noise caused by propagation pulses interferes with the signal to be sensed. Another detection scheme is described in the U.S. Pat. No. 3,846,770 to Schwee in which a magnetic field is applied across the width of the strip causing several reversal domains collapse and utilizing conductor means for sensing the remaining reversal domains.

BRIEF DESCRIPTION OF THE DRAWINGS

In the accompanying drawings forming a material part of this disclosure.

DISCLOSURE OF THE INVENTION

For a further understanding of the invention and of the objects and advantages thereof, reference will be had to the following description and accompanying drawings, and to the appended claims in which the various novel features of the invention are more particularly set forth.

The method and device for detecting Neel wall segments in a cross-tie memory system involves applying a magnetic field of a given polarity to a Neel wall segment having an unknown polarity. If the magnetic field is applied in the same direction as the particular Neel wall segment then the Neel wall segment expands into a transverse domain. The transverse domain thus formed is then sensed with a magnetoresistive detector.

BEST MODE FOR CARRYING OUT THE INVENTION

Figure 1:
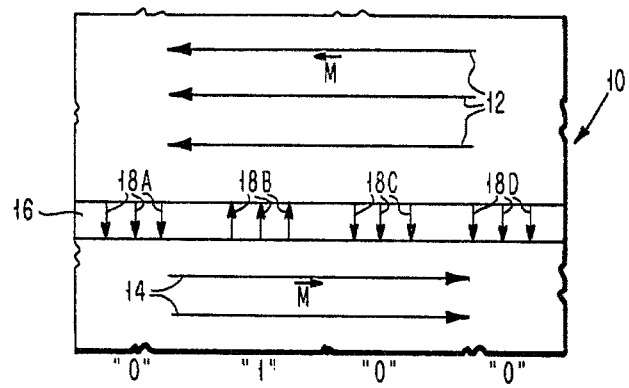
FIG. 1 is a schematic diagram of a cross-tie memory.

As shown in FIG. 1, a cross-tie memory 10 consists of a magnetic domain 12 having a magnetization direction pointed to the left and a magnetic domain 14 with a magnetization direction pointing to the right. Positioned between the domains 12 and 14 is a domain wall 16 containing Neel wall segments 18A, 18B, 18C and 18D. Neel wall segments 18A through 18D are separated by Bloch lines and cross-ties (not shown). Digital information in the cross-tie memory system 10 is represented by the polarity for the direction of the Neel wall segments. For example, Neel wall segments 18A, 18C and 18D have the same polarity and their magnetization direction is pointed downward. These Neel wall segments 18A, 18C and 18D are designated as a "zero" bit of information. Neel wall segment 18B, on the other hand, is of opposite polarity, that is, its magnetization is pointed in the opposite direction and represents a "one" bit of information.

Figure 2:
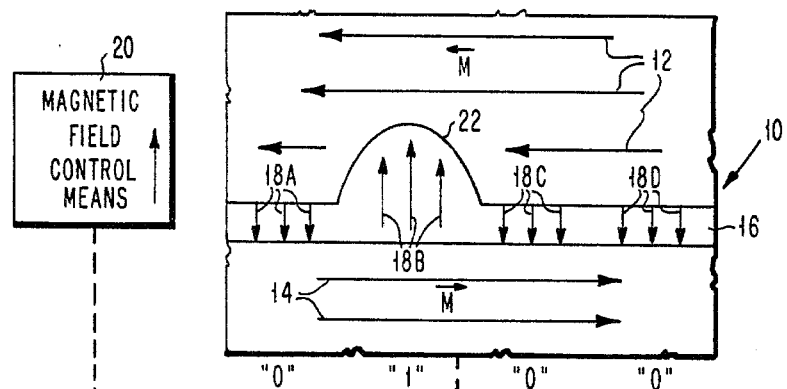
FIG. 2 is a schematic view illustrating the first step of the method in accordance with this invention.

In accordance with this invention as shown in FIG. 2, a magnetic field control means 20 is activated to apply a magnetic field to the Neel wall segment 18B in the cross-tie memory system 10 in the direction indicated. The externally applied magnetic field for example, 10 gauss, causes the Neel wall segments 18B to expand into the domain 12 to form the transverse domain 22. The Neel wall segments 18A, 18C and 18D, which have a polarity in the opposite direction as 18B and as the applied magnetic field, would not form transverse domains if they were moved to the location presently occupied by wall segment 18B and the same magnetic field applied. In other words, a transverse domain 22 will only be formed when the polarity of the Neel wall segment is in the same direction as wall segments 18B. If the wall segments 18B had the opposite polarity, i.e. the same as wall segments 18A, 18C and 18D, then a transverse domain 22 would not be formed.

The memory is in a magnetic film capable of supporting transverse domains, such as (100) oriented garnet films with four-fold in-plane anisotropy.

Figure 3:
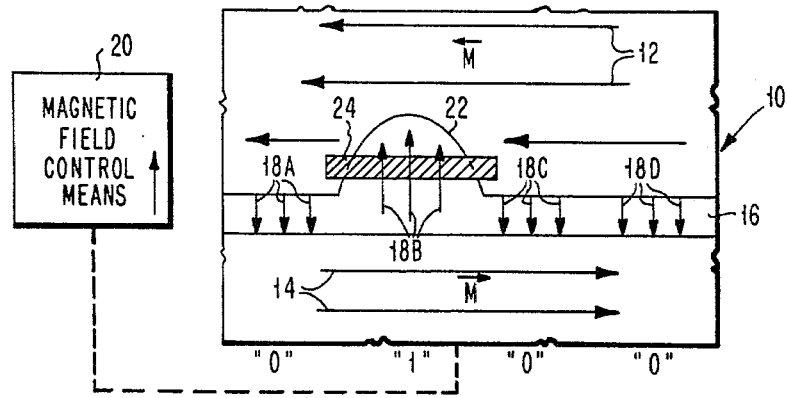
FIG. 3 is a schematic view illustrating the second step of the method in accordance with this invention.

As shown in FIG. 3, a magnetoresistive sensor 24 is positioned so that it is over the transverse domain 22 as shown. The magnetoresistive sensor 24 is of the type described in the Almasi et al U.S. Pat. No. 3,691,540 assigned to the assignee of the present invention. The magnetoresistive sensor 24 is connected to control means (not shown). The magnetoresistive sensor 24 detects or senses the presence or absence of the transverse domain 22. Thus, if a transverse domain 22 is sensed, there was a logical "one" wall segment which formed the domain. If a transverse domain is not sensed, then there was no logical "one" wall segment, i.e. the wall segment was a logical "zero". While only one sensor 24 is shown in FIG. 3, more than one sensor may be used if it is desired to obtain data at more than one position at the same time.

While I have illustrated and described the preferred embodiment of my invention, it is understood that I do not limit myself to the precise constructions herein disclosed and the right is reserved to all changes and modifications coming within the scope of the invention as defined in the appended claims.

I claim:

1. A method for detecting the polarity of a Neel wall segment in a cross-tie memory system in a garnet film with four-fold in-plane anisotropy comprising the steps of:
   applying a magnetic field in a first direction to a Neel wall segment so as to cause a Neel wall segment having a polarity in said first direction to expand into a transverse domain, and
   sensing the presence or absence of said transverse domain.

2. A method as described in claim 1 whereby the magnetic field is applied in a direction that is the same as the polarity of the Neel wall segment.

3. A method as described in claim 1 whereby said transverse domain is sensed with a magnetoresistive detector.

4. A device for detecting the polarity of a Neel wall segment in a cross-tie memory system in a garnet film four-fold in-plane anisotropy comprising:
   means for applying a magnetic field in a first direction to a Neel wall segment to expand a segment having a polarity in said first direction into a transverse domain, and
   sensing means for detecting the presence or absence of said transverse domain.

5. A device as described in claim 4 wherein said sensing means is a magnetoresistive detector.

* * * * *